United States Patent [19]
Allman

[11] Patent Number: 5,645,736
[45] Date of Patent: Jul. 8, 1997

[54] METHOD FOR POLISHING A WAFER

[75] Inventor: Derryl D. J. Allman, Colorado Springs, Colo.

[73] Assignee: Symbios Logic Inc., Fort Collins, Colo.

[21] Appl. No.: 580,674

[22] Filed: Dec. 29, 1995

[51] Int. Cl.$^6$ .................................. C09G 1/00; B24B 1/00
[52] U.S. Cl. .......................... 216/89; 216/88; 156/636.1; 252/79.1; 106/6
[58] Field of Search .................... 156/636.1, 645.1; 216/88, 89; 252/79.1; 106/3

[56] References Cited

U.S. PATENT DOCUMENTS

| | | | |
|---|---|---|---|
| 2,523,281 | 9/1950 | Currie | 106/3 |
| 4,260,396 | 4/1981 | Glemza | 106/3 |
| 4,462,188 | 7/1984 | Payne | 51/283 R |
| 4,544,377 | 10/1985 | Schwen | 51/298 |
| 5,043,012 | 8/1991 | Shinohara et al. | 106/10 |
| 5,264,010 | 11/1993 | Brancaleoni et al. | 51/308 |
| 5,352,277 | 10/1994 | Saski | 106/6 |
| 5,470,798 | 11/1995 | Ouellet | 437/231 |

FOREIGN PATENT DOCUMENTS

| | | | |
|---|---|---|---|
| 2900233 | 7/1979 | Germany | 106/3 |
| 279893 | 6/1990 | Germany | 106/3 |

*Primary Examiner*—R. Bruce Breneman
*Assistant Examiner*—Michael E. Adjodha
*Attorney, Agent, or Firm*—Charles D. Gunter, Jr.; Wayne P. Bailey

[57] ABSTRACT

A method is shown for polishing a workpiece such as a semiconductor wafer. A polishing composition is first formed which includes (1) a polishing media particle; and (2) a film forming binder for suspending the particle and forming a temporary film on an exposed surface of the workpiece, the temporary film being dissolvable in a subsequently applied polishing wash, whereby the polishing media particle is freed to polish the workpiece. The polishing composition is applied to the surface of the semiconductor wafer in a spin coating operation and thereafter cured in a hot plate bake or a furnace operation. In order to polish the workpiece, a polishing wash is applied to either or both of the surface of the workpiece or a polishing pad and thereafter causing the pad to be sufficiently proximate to the surface of the workpiece at a pressure and for a time sufficient to polish and planarize the workpiece.

21 Claims, 2 Drawing Sheets

METHOD FOR POLISHING A WAFER

BACKGROUND OF THE INVENTION

1. Cross Reference to Related Applications

This application is related to the co-pending application of Derryl D. J. Allman, William J. Crosby and James A. Maiolo entitled "Polishing Composition For CMP Operations", filed concurrently herewith.

2. Technical Field

The present invention relates generally to compositions and methods used for polishing and planarizing the surfaces of various workpieces and, more specifically, to compositions and methods used for planarizing workpieces by chemical mechanical polishing of dielectric layers formed over components in the manufacture of semiconductor devices.

3. Description of the Related Art

Compositions useful for polishing the surfaces of various workpieces are well known in the art. Conventional polishing compositions, which are used for polishing the surfaces of semiconductors, glass, crystal, metal and ceramic workpieces, generally comprise aqueous slurries of an appropriate abrasive agent or particle or mixtures of such particles. Commonly utilized abrasive agents include cerium oxide, aluminum oxide, zirconium oxide, tin oxide, silicon dioxide, titanium oxide, etc. Polishing compositions utilizing such agents are generally used by first applying the composition to a polishing pad or to the surface to be polished. The polishing pad is then applied to the surface, which causes the abrasive particles contained within the composition to mechanically abrade the surface, thus effecting the polishing action. However, such conventional polishing compositions used in the general polishing arts cannot produce the highly specular and planar surfaces required in semiconductor and microelectronic component technology. Moreover, conventional polishing compositions have demonstrated disadvantages, such as poor polishing rates and poor surface quality, in polishing other workpieces. For example, the surfaces of glass, metals and semiconductors polished with such compositions demonstrate various defects such as haze, stains, scratches, undulations, undercuts, mesas, etc.

Attempts have been made in the prior art to improve the existing, commercially useful polishing compositions. Two methods of attaining improvement in these areas include (1) the combination of various abrasives; and (2) adding various adjuvants to the compositions.

Examples of combinations of abrasive particles include combinations of, e.g., cerium oxide and a rare earth pyrosilicate. Examples of the use of adjuvants in polishing compositions include the use of salts such as potassium chloride or ammonium chloride or combinations of such salts to promote the polishing effectiveness of the metal surface by the abrasive agent. However, even the addition of abrasive agents or the addition of adjuvant materials, have failed to produce completely satisfactory polishing compositions capable of producing the planarized surfaces needed in modern semiconductor and microelectronics technology.

Modern semiconductors are typically produced by slicing a silicon or germanium crystal ingot, forming a "wafer." The surface of these wafers is polished to form a flat surface having as little roughness as possible. It is advantageous to provide a flat or planarized surface for the purpose of avoiding problems, such as non-uniform resist exposure, as well as for many other reasons. Planarization is commonly achieved by providing a planarizing layer over a topographical surface which is a dielectric substance. The dielectric substance may be, for example, a spin-on-glass. Such planarizing layers generally provide a high degree of planarization for periodic features which are approximately 10 microns or smaller. However, such planarizing layers provide relatively poor planarization for underlying features having a larger periodicity. Rather, the upper surface of the planarizing layer tends to reflect the topography of the underlying structures. Consequently, polishing techniques, ordinarily using a rotating soft pad and a fluid or slurry between the pad and the surface, are employed to obtain long range planarization where the underlying features are spatially large.

Preparation of semiconductors and other microelectronic components generally involves building many interconnected layers of components upon a wafer substrate. Thus, compositions useful for polishing or planarizing semiconductors must be able to polish complex composite surfaces which are comprised of multiple layers of interconnected high density integrated circuits both at and below the surface. In preparing semiconductors, the structure resulting from the interconnected layers of integrated circuitry is polished down to a predetermined planar level which may comprise components of varying size, shape and hardness, as well as trenches, holes and valleys of various depth and shapes. After such polishing, semiconductor preparation may continue by various other procedures, such as chemical vapor deposition, metalization via vapor deposition, photolithographic patterning, diffusion, etching, etc., as will be recognized by those skilled in the art.

To provide superior results, special chemical mechanical polish (CMP) compositions are used to polish or planarize the surfaces of prepared semiconductor workpieces. However, unlike conventional polishing to provide a planar surface, the polishing action must be restricted to the level surface of the workpiece and must not affect the topography, morphology and/or structures below the surface. Only such selective polishing action will produce the desired planar surface. Conventional polishing compositions are not well suited for such procedures as they merely produce uneven, undulating surfaces by abrading certain regions on, below and within the surface of the workpiece. It has proven difficult to use conventional polishing products to obtain smooth defect-free surfaces wherein the polishing composition does not adversely affect the underlying structure of the workpiece.

Even where specially designed CMP compositions are applied as an aqueous slurry to the workpiece, other shortcomings exits such as a high consumption rate of slurry, as well as shortcomings in the delivery of slurry to the center of the semiconductor wafer, via the polishing pad, while polishing the surface of the wafer flat. The polishing pad used also deforms to the surface of the wafer, preventing 100% perfect planarization from being achieved. Another problem with the prior art processes is that the CMP operation upon an oxide has no end point capability and therefore is dependent upon knowing and controlling the removal rate such that the operation can be timed to control the degree of planarization.

Accordingly, it can be seen that a long felt need exists for polishing compositions which provide improved polishing activity at improved rates and which will produce planar and defect-free surfaces as well as methods for the use of such compositions.

SUMMARY OF THE INVENTION

In the method of the invention, a polishing composition is first formulated which includes a polishing media particle and a film forming binder for suspending the particle and forming a temporary film on the surface of a workpiece. The temporary film is dissolvable in a subsequently applied polishing wash, Whereby the polishing media particle is freed to polish the surface of the workpiece. The polishing composition is applied to the surface of the workpiece and, thereafter, the workpiece is polished or planarized by mechanically and chemically causing the film forming binder to be dissolved, thereby gradually freeing the polishing media particles and allowing the freed particles to abrade the surface of the workpiece to an extent.

Preferably, the polishing composition is applied to a selected one of the surface of the workpiece and a polishing pad and the pad is then caused to be sufficiently proximate the surface of the workpiece at a pressure and for a time sufficient to polish and planarize the workpiece. In the most preferred case, the workpiece is a semiconductor wafer having regions of relatively less and more electronic device integration density, the surface of the wafer having a plurality of steps and gaps between at least some of the steps. The surface of the wafer, in such cases, has a planar level above which no workpiece material is desired and below which there exists electronic components which are desirably defect free. The method of the invention further comprises planarizing the surface of the wafer to the planar level without substantially adversely affecting the wafer below the planar level.

In the CMP operation of the invention, the surface of the wafer is coated with the polishing composition of the invention. The composition can be cured by a hot plate bake or furnace operation. The subsequent film which is formed on the surface of the wafer serves as a source of particle containing slurry across the surface of the wafer. The film serves to protect the lower regions of the wafer from being planarized while the relatively higher regions are being eroded away, resulting in a higher degree of planarization across the surface of the wafer. Once the film which contains the particle slurry is depleted, the removal rate of the oxide wafer is reduced or ceases on that part of the wafer. Therefore, the process is self limiting. By controlling the thickness of the applied film, the degree of planarization can be precisely controlled. The method of the invention eliminates delivery problems of the particle containing slurry to the center of the wafer, because the resulting film provides the slurry to that part of the wafer. The cost of the operation is reduced because the slurry is not being constantly dispensed onto the polishing pad during the polishing operation.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
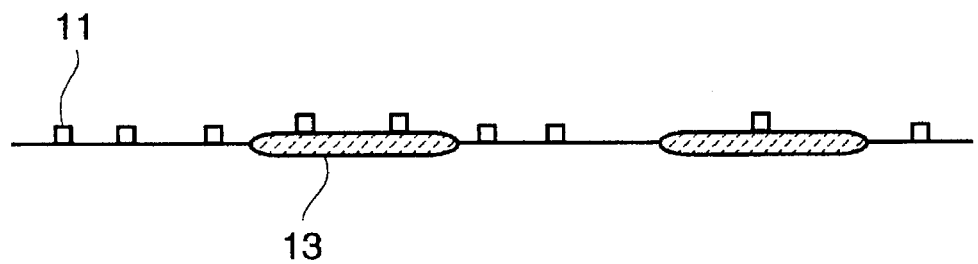
FIG. 1 shows the surface topology which exists after the formation of transistors on a silicon wafer substrate.

In the method of the present invention, a special chemical mechanical polishing (CMP) composition is first formulated. A CMP composition, as will be familiar to those skilled in the art, acts to mechanically and chemically abrade and dissolve the surface of the workpiece to a predetermined and desired extent. Additionally, the polishing compositions of the invention are curable chemical solutions which are used to form a temporary film on the surface of a substrate to be polished. The first component of the polishing compositions of the invention is a polishing media particle which can be selected from the group consisting of silica, calcium oxide, aluminum oxide, silicon nitride, silicon carbide, cesium oxide, natural and synthetic diamond, tungsten oxide, titanium nitride, titanium oxide, other materials harder than silicon dioxide and combinations thereof. The particle size is generally less than about 1 micron. The term "particle size" as used herein refers to the average diameter of the particles, or if the particles are not substantially spherical, the average maximum dimension of the particles. Larger particles have been found to produce deep scratches in the substrate, producing a less than desirable result.

The polishing media particles are present in the compositions of the invention in an amount which defines a solids content for the compositions. The polishing media particle solids content is less than about 80% by weight of the compositions of the invention. The term "percent" or "%" as used herein, unless otherwise stated or unless it is otherwise clear from the context in which it is used, refers to the percentage by weight of the indicated components in relation to the total weight of the polishing composition of the invention.

Preferably, the polishing media particle is a silica particle. It should be noted that in the discussion which follows, "silica" means fumed silica. Various other forms of silicon exist, and are to be distinguished from the elemental silicon of the compositions of the invention. Fumed silica is available commercially from several sources and is manufactured by hydrolysis of a volatile silane compound, such as silicon tetrachloride, in an oxygen-hydrogen gas flame. Precipitated silica is also available commercially from several sources. Generally, precipitated silica is made by reacting an alkaline silicate solution, such as sodium silicate with a mineral acid, such as sulfuric acid, generally under alkaline reaction conditions. Silica is the major reaction product formed by precipitation. A detailed description of the various forms of silicon and silica materials is presented in U.S. Pat. No. 5,352,277, to Sasaki, issued Oct. 4, 1994, the disclosure of which is incorporated herein by reference. For purposes of the present invention silica (Si) particles and not $SiO_2$ are utilized as the preferred abrasive component of the compositions.

The polishing compositions of the invention also includes a film forming binder for suspending the particle and forming a temporary film on the target substrate, the temporary film being dissolvable in a subsequently applied polishing wash, whereby the polishing media particle is freed to polish the target substrate. The film forming binder is part of a solution which contains the polishing media particle which exists with or is attached to a polymer matrix or which is suspended in a solution of alcohol, water or acid.

The polymer which is used as a part of the film forming binder can have a backbone of carbon, silicon, cesium or a combination of these elements, with or without an oxygen or halogen element in the backbone. The structure of the polymer is not critical. The polymer is used as a binding or holding film or holding matrix for the polishing particle on the surface of the substrate. The polymer which is applied as a temporary film to the substrate is dissolved during the polishing action, releasing the polishing particle. The preferred polymer used to form a temporary film on the target substrate is a polyorganosiloxane. Other polymeric materials include polymers of acrylamide, acrylic acid, methacrylic acid, maleic acid, ethylene oxide, and vinylpyrrolidone, polymers of cellulose, guar polymers, graft copolymers of guar and cellulose, xanthan polymers, etc. It is only necessary that the polymer evenly disperse and hold the polishing media particles in a temporary film or matrix on the target substrate to be polished and that the binder be dissolvable or depletable in the subsequently applied polishing slurry or wash.

The organopolysiloxane polymers employed in the preferred matrices of the invention are well known materials and can be made by standard methods known in the art. The preferred polymer is an organopolysiloxane which contains methyl, vinyl, phenyl and/or 3, 3, 3-trifluropropyl radicals attached to the silicone atoms of the polymeric siloxane. Examples of organopolysiloxanes are those polymers, copolymers and mixtures thereof wherein the siloxy units can be dimethylsiloxane, phenylmethylsiloxane, 3, 3, 3-trifluoropropylmethyl siloxane, diphenylsiloxane, methylvinylsiloxane, and phenylvinylsiloxane. A discussion of the preparation of such compounds can be found, for example, in: Eaborn, D., "Organo Silicone Compounds", Academic Press, New York, 1959; Montermoso, J. C., "Silicone Rubbers", Morton, E. D., "Introduction to Rubber Technology", Reinhold Publishing Corp., New York, 1959; Rochow, E. G., "An Introduction to the Chemistry of Silicones", to Ed. John Wiley and Sons, New York, 1951.

The polymer in solution can be used to control the polishing selectivity of one material to another on the substrate being polished. A carbon based backbone polymer can retard the polishing rate of $SiO_2$ relative to metal. The CeO polymer backbone can enhance the polish rate of $SiO_2$ relative to a metal. Optional R groups attached to the polymer backbone can also be used to enhance or retard the polishing action of the material being polished. The R groups can contain $NH_2$, F, Br, Cl, I, OH, NO, CeO or other groups besides $CH_x$ groups.

The percentage of polymer to the polishing particle can be used to control the polishing selectively or polishing rates. The length or size of the polymer is solution controls the thickness of the film on the substrate, its gap filling capability and product lifetime. The polymer is also used to prevent agglomeration of the polishing particles and allows more polishing particles to be held in suspension.

When the polymer is attached to the particle it can act as a binding media increasing the residence time of the particle on the substrate, thus improving the polishing efficiency. Organic materials that contain amine or vinyl groups that have been attached to the surface of the particle can also cause this effect.

The polishing composition, in addition to a polishing media particle and a film forming binder can include a solvent for suspending the polishing media particle in the film forming binder to facilitate forming the temporary film. Various solvents can be used in the solution including alcohols, acids and water. Acceptable acids include aliphatic carboxylic acids having about 5 to 10 carbon atoms, e.g., adipic acid and citric acid. Acceptable alcohols include simple, monofunctional and polyfunctional alcohols. Example alcohols include methanol and isopropanol, which are both commonly available from a number of commercial sources. The choice of solvent or solvents is determined by the coat characteristics of the solution on the surface of an IC wafer. The higher boiling point solvents are desired because they do not evaporate as quickly during the coat operation, allowing the film on the surface of the IC wafer to set up slowly, producing a very even coating across the surface of the wafer.

The polishing compositions can also include a wetting gent to improve the wettability of the composition on the exposed surface of the wafer workpiece. Preferably, the wetting agent is an organofunctional silane. The most preferred wetting agent is a gamma amino propyl triethoxy siloxane which is commercially available from OSI Specialties Company as A-1100.

Although they have unlimited use in polishing various workpieces, the compositions of the invention can be advantageously used in polishing or planarizing the surfaces of interconnected, integrated circuits in semiconductor preparation. The present compositions are used to polish the dielectric layer down to a predetermined, planar level which may be composed of components of varying size, shape and hardness, as well as trenches, holes and valleys. Once the polishing of the dielectric layer such as amorphous silica is completed, additional conventional processing is done to form the next metal interconnect wiring layer. This surface may then be further planarized or polished to the desired extent. The metal interconnect wiring layers may also be removed or planarized using this process.

Thus, the present compositions can be used to polish or planarize the complex composite surfaces of semiconductor wafers to provide the extremely flat and level surfaces necessary in semiconductor technology. The present compositions can be used to polish surfaces of semiconductor wafers having a predetermined planar level, above which no portion of workpieces desired and below which exist electronic components which are defect-free. The surface can be planarized to the planar level without substantially causing adverse defects in the wafer below this planar level. Thus the present method can be used to polish or planarize semiconductor wafers having regions of relatively less and relatively more electronic device integration density, wherein the surface of the workpiece comprises a plurality of steps and a plurality of gaps between the steps.

Figure 2:
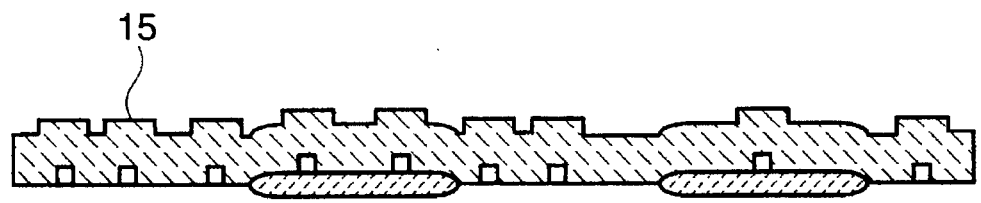
FIG. 2 shows the surface topology after deposition of 14000A of BPSG oxide across the surface of the wafer and densification of the film at 850° C. for 30 minutes in nitrogen.
Figure 3:
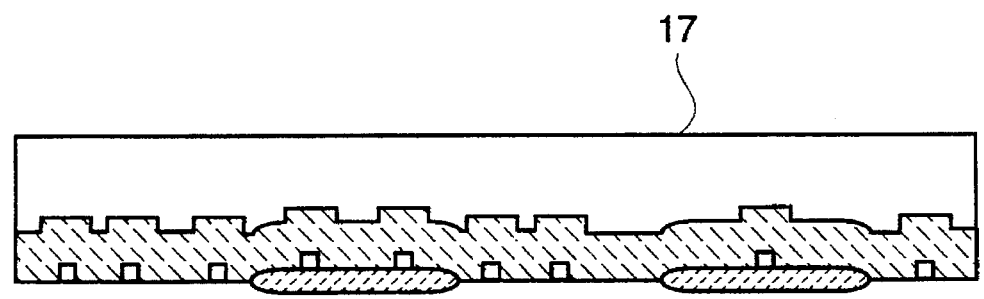
FIG. 3 shows a film of the polishing composition of the invention placed onto the wafer using a wafer coater.

FIG. 1 shows a wafer surface topology existing after the formation of transistors on a wafer substrate. Note the areas of polysilicon 11 and field oxide (transistor isolation oxide) 13. FIG. 2 shows the deposition of 14000A of BPSG oxide 15 across the surface of the wafer and densification of the film at 850° C. for 30 minutes in nitrogen. A film of the composition of the invention containing the polishing slurry is placed onto the wafer as shown in FIG. 3 in the form of a spin-on slurry 17, using a conventional wafer coater (not shown). The carrier solvents are removed from the composition during the spin coating operation. The coat process consists of dynamically dispensing 6 ml of the composition containing the slurry followed by a slow spin operation at 400 rpm. The wafer is then ramped to 1000 rpm for 20 seconds to dry the material to the final film thickness. The wafer spin speed is reduced to 400 rpm and the backside of the wafer is washed using high IPA or n-butanol, back side edge bead removal (EBR). Three mm in from the edge of the front side of the wafer is cleaned using IPA or n-Butanol, front side EBR. The wafer is then dried at 400 rpm before being removed.

Figure 4:
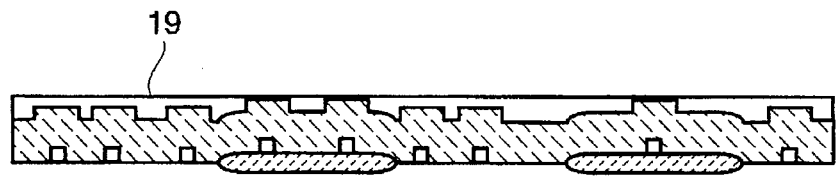
FIG. 4 shows a wafer which has been polished until the very top of the high BPTEOS structures have been uncovered.

During the polishing operation, the polishing pad is placed sufficiently proximate to the surface of the workpieces at a sufficient pressure and for a sufficient time to polish or planarize the surface of the workpiece by mechanically abrading the surface to a predetermined extent. Suitable polishing pads are commercially available from a number of sources such as the R. H. Strasbaugh 6DS-SP planarizer manufactured by R. Howard Strasbaugh, Inc. of San Luis Obispo, Calif. or the Westech Model 372 Automatic Wafer Polisher by Westech Systems, Inc. of Phoenix, AZ. As shown in FIG. 4, the wafer has been polished until the very top 19 of the high BPTOS structures have been uncovered. The slurry that remains in the lower areas on the wafer serves as a source of slurry for the local regions were slurry does not exist.

Figure 5:
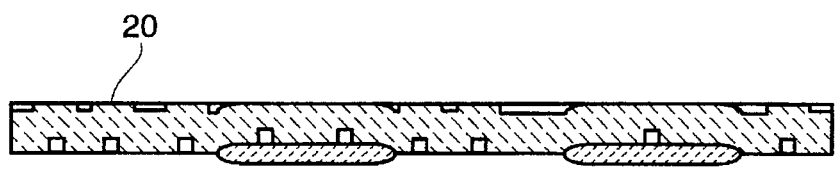
FIG. 5 shows the majority of the composition of the invention having been removed from the wafer leaving only small pockets of slurry which slows the polishing rate.
Figure 6:
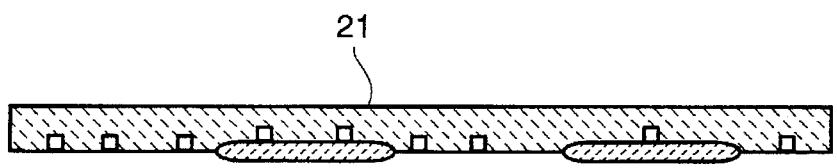
FIG. 6 shows the same wafer with all of the slurry removed from the wafer, causing the polishing action to cease or slow down and leaving a planar surface.
Figure 7:
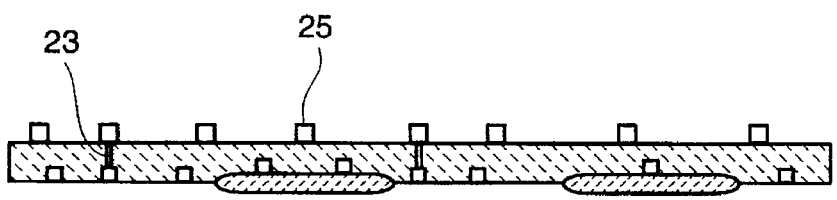
FIG. 7 shows the next level of interconnect that can be formed on the previously planarized surface.

As shown in FIG. 5, the majority of the slurry has been removed from the wafer leaving only small pockets of slurry which slows the polishing rate. Once all of the slurry has been removed from the wafer, the polishing action ceases or slows down, depending on the polish conditions, leaving a planar or flat surface (21 in FIG. 6). As shown in FIG. 7, the next level of interconnect can then be formed on the planar surface. The next level of interconnect illustrated is formed using photolithography and etch processes. Connection between the interconnect levels is provided by a tungsten plug process. FIG. 7 shows the tungsten plugs 23 and metal interconnect wiring 25.

Thus, the polishing compositions of the invention are first applied to the target substrate, such as semiconductor wafer, and are allowed to form a temporary film on the exposed surface of the substrate. A CMP operation can then be carried out. DI water is dispensed onto the polishing pad used in the CMP operation. The applied film on the substrate wafer has a higher removal rate than $SiO_2$ in DI water. As the temporary binder film is eroded the silica particles and other chemicals are released. The released silica particles polish away the oxide as it becomes exposed. The concentration of silica in the film controls the oxide removal rate and thus the degree of planarization.

An invention has been provided with several advantages. The polishing method of the invention can be advantageously used in CMP polishing operations to provide an improved degree of global planarity. There is a reduced consumption of slurry. The method of the invention results in a self limiting process. Slurry delivery problems are eliminated across the surface of the substrate wafer. An improved uniformity in removal rate across the surface of the wafer is achieved. Further agglomeration of the slurry is prevented by suspending it within a polymer holding matrix. The method of the present invention results in improved safety and extended lifetime of consumable components. The silica particles used in the polishing compositions can be combined with other sol-gel particles pretreated with other metallic organic solutions or grown in acid or basic hydrolysis reaction to change the properties of the process with regard to selectivity, and type of planarization achieved. The method of the invention can be used for all types of CMP process including oxide, metal and organic.

While the invention has been particularly shown and described with reference to a preferred embodiment, it will be understood by those skilled in the art that various changes in form and detail may be made therein without departing from the spirit and scope of the invention.

What is claimed is:

1. A method of polishing or planarizing a surface of a workpiece, the method comprising the steps of:

applying a polishing composition to the surface of the workpiece, the polishing composition including a polishing media particle and a film forming binder for suspending the particle and forming a temporary film on the surface of the workpiece, the temporary film being dissolvable in a subsequently applied polishing wash, whereby the polishing media particle is freed to polish the surface of the workpiece; and polishing or planarizing the surface of the workpiece by dissolving the film forming binder, thereby gradually freeing the polishing media particles and allowing the freed particles to abrade the surface of the workpiece to an extent.

2. The method of claim 1, wherein the surface of the workpiece is polished or planarized by mechanically and chemically causing the film forming binder to be dissolved.

3. The method of claim 2, further comprising the steps of:

applying a polishing wash to a selected one of the surface of the workpiece and a polishing pad and then causing the pad to be sufficiently proximate to the surface of the workpiece at a pressure and for a time sufficient to polish and planarize the workpiece.

4. The method of claim 1, wherein the polishing media particle is selected from the group consisting of:

silica, calcium oxide, aluminum oxide, silicon nitride, silicon carbide, cesium oxide, natural and synthetic diamond, tungsten oxide, titanium nitride, titanium oxide, other materials harder than silicon dioxide and combinations thereof.

5. The method of claim 4, wherein the polishing media particle is a silica particle less than about one micron in size.

6. The composition of claim 1, wherein the film forming binder is a natural or synthetic polymer.

7. The method of claim 1, wherein the workpiece is a semiconductor wafer having regions of relatively less and more electronic device integration density, the surface of the wafer having a plurality of steps and gaps between at least some of the steps.

8. The method of claim 7, wherein the surface of the wafer has a planar level above which no workpiece material is desired and below which there exists electronic components which are desirably defect free, the method further comprising planarizing the surface of the wafer to the planar level without substantially adversely affecting the wafer below the planar level.

9. The method of claim 1, wherein at least selected regions of the surface of the workpiece are coated with the polishing composition by means of a spin coating operation.

10. The method of claim 9, further comprising the steps of:

curing the spin coated polishing composition by means of a hot plate bake or furnace operation.

11. The method of claim 10, wherein the polishing wash which is applied to the cured film is an aqueous slurry.

12. A method of formulating a polishing or planarizing composition for polishing or planarizing a surface of a workpiece, the method comprising the steps of:

formulating a polishing composition which comprises a curable chemical solution by combining in solution:

(a) a polishing media particle having a particle size less than about one micron, present in an amount to define a solids content for the composition;

(b) a film forming binder for suspending the particle and forming a temporary film on an exposed surface of the workpiece, the temporary film being dissolvable in subsequently applied polishing wash, whereby the polishing media particle is freed to polish the workpiece;

(c) a solvent for suspending the polishing media particle in the film forming binder to facilitate forming the temporary film;

(d) a wetting agent to improve the wettability of the composition on the exposed surface of the workpiece; and (e) wherein the polishing media particle solids content is less than about 80% by weight.

13. A method of polishing or planarizing a surface of a workpiece, the method comprising the steps of:

forming a polishing composition comprising:

(a) a polishing media particle having a particle size less than about one micron, present in an amount to define a solids content for the composition;

(b) a film forming binder for suspending the particle and forming a temporary film on an exposed surface of the workpiece, the temporary film being dissolvable in subsequently applied polishing wash, whereby the polishing media particle is freed to polish the workpiece;

(c) a solvent for suspending the polishing media particle in the film forming binder to facilitate forming the temporary film;

(d) a wetting agent to improve the wettability of the composition on the exposed surface of the workpiece; and (e) wherein the polishing media particle solids content is less than about 80% by weight.

applying the polishing composition to the surface of the workpiece; and polishing or planarizing the surface of the workpiece by dissolving the film forming binder, thereby gradually freeing the polishing media particles and allowing the freed particles to abrade the surface of the workpiece to an extent.

14. The method of claim 13, wherein the surface of the workpiece is polished or planarized by mechanically and chemically causing the film forming binder to be dissolved.

15. The method of claim 11, wherein the polishing media particle is selected from the group consisting of:

silica, calcium oxide, aluminum oxide, silicon nitride, silicon carbide, cesium oxide, natural and synthetic diamond, tungsten oxide, titanium nitride, titanium oxide, other materials harder than silicon dioxide and combinations thereof.

16. The method of claim 15, wherein the film forming binder is a polyorganosiloxane.

17. The method of claim 16, wherein the solvent is an alcohol.

18. The method of claim 17, wherein the wetting agent is an organofunctional silane.

19. The method of claim 18, further comprising the steps of:

applying a polishing wash to a selected one of the surface of the workpiece and a polishing pad and then causing the pad to be sufficiently proximate to the surface of the workpiece at a pressure and for a time sufficient to polish and planarize the workpiece.

20. The method of claim 19, wherein the workpiece is a semiconductor wafer having regions of relatively less and more electronic device integration density, the surface of the wafer having a plurality of steps and gaps between at least some of the steps.

21. The method of claim 20, wherein the surface of the wafer has a planar level above which no workpiece material is desired and below which there exists electronic components which are desirably defect free, the method further comprising planarizing the surface of the wafer to the planar level without substantially adversely affecting the wafer below the planar level.

* * * * *